(12) United States Patent
Nakada et al.

(10) Patent No.: US 10,443,122 B2
(45) Date of Patent: Oct. 15, 2019

(54) VACUUM PROCESSING DEVICE (71) Applicants: IHI Corporation, Koto-ku (JP); Kaji Seisakusho Co., Ltd, Kahoku-shi (JP)

(72) Inventors: Yukihiro Nakada, Tokyo (JP); Kenichiro Watanabe, Tokyo (JP); Yasutomo Tanaka, Tokyo (JP); Hideki Kitagawa, Ishikawa (JP); Kenichi Sodeno, Ishikawa (JP)

(73) Assignees: IHI Corporation, Koto-ku (JP); Kaji Seisakusho Co., Ltd, Kahoku-shi (JP)

( * ) Notice: Subject to any disclaimer, the term of this patent is extended or adjusted under 35 U.S.C. 154(b) by 323 days.

(21) Appl. No.: 15/284,155

(22) Filed: Oct. 3, 2016

(65) Prior Publication Data

US 2017/0022606 A1  Jan. 26, 2017

Related U.S. Application Data (63) Continuation of application No. PCT/JP2015/061133, filed on Apr. 9, 2015.

(30) Foreign Application Priority Data

Apr. 11, 2014  (JP) .................................. 2014-081971

(51) Int. Cl.
*C23C 14/56* (2006.01)
*C23C 16/34* (2006.01)
(Continued)

(52) U.S. Cl.
CPC .......... *C23C 14/562* (2013.01); *B65H 69/04* (2013.01); *C23C 14/0605* (2013.01);
(Continued)

(58) Field of Classification Search
None
See application file for complete search history.

(56) References Cited

U.S. PATENT DOCUMENTS

| 4,343,836 A | 8/1982 | Newkirk et al. |
| 5,405,654 A * | 4/1995 | Gabor .................. C04B 41/009 |
| | | 419/24 |

(Continued)

FOREIGN PATENT DOCUMENTS

| CN | 1455827 A | 11/2003 |
| CN | 104755654 A | 7/2015 |

(Continued)

OTHER PUBLICATIONS

Combined Chinese Office Action and Search Report dated Feb. 27, 2018 in Patent Application No. 201580017283.3 (with English translation of Categories of Cited Documents), citing documents AO and AP therein, 9 pages.

(Continued)

*Primary Examiner* — Jethro M. Pence
(74) *Attorney, Agent, or Firm* — Oblon, McClelland, Maier & Neustadt, L.L.P.

(57) ABSTRACT

A device of executing vacuum processing has a chamber capable of keeping the chamber as a whole in a depressurized state; a feeding roller so disposed as to hang a reinforcement fiber down in the chamber; a processor so disposed in the chamber as to pass the reinforcement fiber hung down in the chamber through the processor; a capture device so disposed as to capture and keep a leading end of the reinforcement fiber passing the processor and vertically falling down in place; a winding bobbin configured to wind the reinforcement fiber processed by the processor; and a resilient cord withdrawn in synchronism with the winding bobbin from a first position where the resilient cord surrounds the leading end kept in place by the capture device to a second position where the resilient cord gets in contact with and leads the reinforcement fiber to the winding bobbin.

9 Claims, 5 Drawing Sheets

(51) Int. Cl.
    *C23C 16/26* (2006.01)
    *C23C 16/54* (2006.01)
    *C23C 14/06* (2006.01)
    *C23C 14/24* (2006.01)
    *B65H 69/04* (2006.01)
    *F27B 9/28* (2006.01)

(52) U.S. Cl.
    CPC .......... *C23C 14/0647* (2013.01); *C23C 14/24* (2013.01); *C23C 16/26* (2013.01); *C23C 16/342* (2013.01); *C23C 16/545* (2013.01); *F27B 9/28* (2013.01)

(56) References Cited

U.S. PATENT DOCUMENTS

| | | |
|---|---|---|
| 6,615,547 B2 | 9/2003 | Evers et al. |
| 9,695,504 B2 | 7/2017 | Nakada et al. |
| 2002/0069826 A1* | 6/2002 | Hunt ................... C23C 16/4412 118/718 |
| 2008/0210365 A1 | 9/2008 | Franchet et al. |

FOREIGN PATENT DOCUMENTS

| | | |
|---|---|---|
| GB | 2 057 018 A | 3/1981 |
| JP | 59-84586 A | 5/1984 |
| JP | 5-251361 A | 9/1993 |
| JP | 6-172033 | 6/1994 |
| JP | 7-197264 | 8/1995 |
| JP | 2003-144900 A | 5/2003 |
| JP | 2011-157632 | 8/2011 |
| JP | 5649040 | 1/2015 |
| RU | 2 085 628 C1 | 7/1997 |
| RU | 2 466 924 C2 | 11/2012 |
| WO | WO 2014/061433 A1 | 4/2014 |

OTHER PUBLICATIONS

Extended European Search Report dated Nov. 29, 2017 in Patent Application No. 15776174.3.
International Search Report dated Jun. 23, 2015 in PCT/JP2015/061133, filed on Apr. 9, 2015 (with English Translation).
Written Opinion dated Jun. 23, 2015 in PCT/JP2015/061133, filed on Apr. 9, 2015.
Decision to Grant dated Apr. 23, 2018 in Russian Patent Application No. 2016143724/02(070106) (with English language translation) citing documents AO and AP therein, 12 pages.

* cited by examiner

VACUUM PROCESSING DEVICE

CROSS-REFERENCE TO RELATED APPLICATIONS

This application is a Continuation Application of PCT International Application No. PCT/JP2015/061133 (filed Apr. 9, 2015), which is in turn based upon and claims the benefit of priority from Japanese Patent Application No. 2014-081971 (filed Apr. 11, 2014), the entire contents of which are incorporated herein by reference.

BACKGROUND

Technical Field

The disclosure relates to a vacuum processing device available for a process of forming a coating on a reinforcement fiber, and in particular to a vacuum processing device in which a bobbin can be exchanged while the most part of the device is kept evacuated.

Description of the Related Art

Ceramic matrix composites (CMC) are articles in which reinforcement fibers of ceramics are combined by matrices of ceramics. The SiC/SiC composite for example, in which reinforcement fibers of silicon carbide are combined by a matrix of silicon carbide, shows promise for the application as turbine components or such of jet engines.

As silicon carbide fibers as produced are poor in ability of bonding with the matrix, there may be a case where any coating such as boron nitride is formed thereon. Vacuum processing can be exemplified as a process for such coating. Japanese Patent Applications Laid-open No. H07-197264 and No. 2011-157632 disclose related arts.

SUMMARY

To form a coating on silicon carbide fibers by a vacuum processing, its reaction chamber necessarily requires considerably elongated dimensions in order to ensure a sufficient reaction time. To obtain a sufficient degree of vacuum throughout such a long reaction chamber requires continuous operation of vacuum pumps for a considerably long time. On the other hand, before and after the process, it is necessary to execute tasks of taking out the processed fiber, loading new fibers, passing the fiber through the reaction chamber, and connecting it to a winding bobbin. These tasks require exposure of the reaction chamber to the atmosphere for a considerable time. As gaseous molecules would adhere on the internal surface of the reaction chamber exposed to the atmosphere and, in the process of evacuation, continue to escape therefrom, very long time is necessary to obtain a sufficient degree of vacuum again. Therefore, even though one could execute the coating process for a short time, processes before and after the coating process require a long time (around the clock for example) and thus the productivity of the vacuum processing is extremely limited. The content of the disclosure herein has been created in light of this problem.

According to a first aspect, a device of executing vacuum processing on a reinforcement fiber, is comprised of: a chamber capable of keeping the chamber as a whole in a depressurized state; a feeding roller so disposed as to hang the reinforcement fiber down in the chamber; a processor so disposed in the chamber as to pass the reinforcement fiber hung down in the chamber through the processor; a capture device so disposed as to capture and keep a leading end of the reinforcement fiber passing the processor and vertically falling down in place; a winding bobbin configured to wind the reinforcement fiber processed by the processor; and a resilient cord withdrawn in synchronism with the winding bobbin from a first position where the resilient cord surrounds the leading end kept in place by the capture device to a second position where the resilient cord gets in contact with and leads the reinforcement fiber to the winding bobbin.

Preferably, the chamber is comprised of a first sub-chamber housing the feeding roller, a main chamber housing the processor, and a second sub-chamber housing the capture device, the winding bobbin and the resilient cord, and the main chamber is configured to temporarily get gas-tightly separated from the first sub-chamber and the second sub-chamber. Still preferably, a proximal end of the resilient cord is so combined with the winding bobbin as to be withdrawn by rotation of the winding bobbin. Further preferably, a distal end of the resilient cord is fixed to a site other than the resilient cord and the resilient cord in the first position forms an open loop surrounding the reinforcement fiber. Further still preferably, the distal end of the resilient cord is combined with the winding bobbin.

According to a second aspect, a method of executing vacuum processing on a reinforcement fiber, is comprised of: keeping a chamber as a whole in a depressurized state; hanging the reinforcement fiber from a feeding roller down in the chamber; passing the reinforcement fiber through a processor disposed in the chamber; disposing a capture device so as to capture and keep a leading end of the reinforcement fiber passing the processor and vertically falling down in place; disposing a resilient cord at a first position where the resilient cord encloses the leading end kept in place by the capture device above or around the capture device; withdrawing the resilient cord in synchronism with a winding bobbin to a second position where the resilient cord gets in contact with and leads the reinforcement fiber to the winding bobbin; and making the winding bobbin wind the reinforcement fiber processed by the processor.

Preferably the aforementioned method is further comprised of combining a proximal end of the resilient cord with the winding bobbin, wherein the resilient cord is withdrawn by rotation of the winding bobbin in the step of withdrawing the resilient cord. Further preferably, the aforementioned method is further comprised of fixing a distal end of the resilient cord to a site other than the resilient cord so as to have the resilient cord in the first position form an open loop surrounding the reinforcement fiber. Further still preferably, the aforementioned method is further comprised of combining the distal end of the resilient cord with the winding bobbin.

DETAILED DESCRIPTION OF THE EXEMPLARY EMBODIMENTS

Exemplary embodiments will be described hereinafter with reference to the appended drawings. It is particularly noted that these drawings are not always drawn to scale exactly and therefore dimensional relations among elements are not limited to those shown therein.

Figure 1:
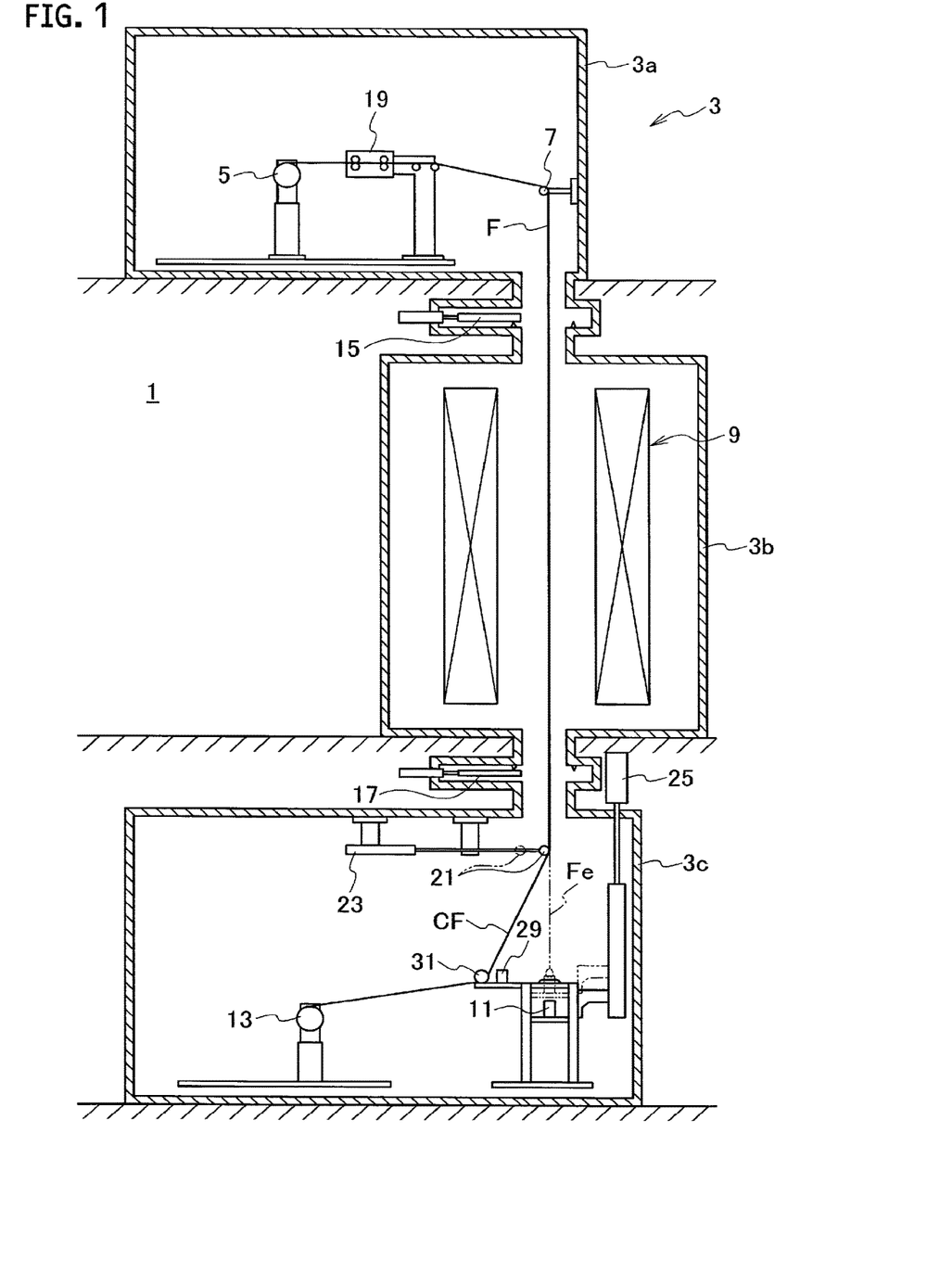
FIG. 1 is a schematic sectional view of a vacuum processing device in accordance with an embodiment.

Referring to FIG. 1, a vacuum processing device 1 of the present embodiment is applicable to use for forming a coating on a reinforcement fiber F by a process such as CVD or PVD that requires vacuum. Examples of the reinforcement fiber are silicon carbide, carbon, and alumina and examples of the coating are boron nitride and carbon, but of course these examples are not limiting. The present embodiment is applicable to a vacuum processing not only on a monofilament but also on a yarn, a tow, a web, or a fabric in which a plurality of fibers is bundled.

The vacuum processing device 1 is in general comprised of a chamber 3, a feeding bobbin 5 for feeding the reinforcement fiber F, a roller 7 for hanging down the fed reinforcement fiber F, a processor 9 for executing a process such as CVD, a capture device 11 for capturing a leading end Fe of the reinforcement fiber F passing the processor 9, and a winding bobbin 13 for winding the reinforcement fiber CF processed in the processor 9. Plural sets of feeding bobbins 5, feeding rollers 7, capture devices 11 and winding bobbins may be arranged in parallel and a plurality of reinforcement fibers F may be made to pass through the processors 9 simultaneously.

The chamber 3 is a vacuum chamber that can keep itself as a whole in a depressurized state. The chamber 3 is further sectioned into a plurality of sub-chambers. In the example shown in the drawing, the chamber 3 is comprised of a first sub-chamber 3a housing the feeding bobbin 5 and the feeding roller 7, a main chamber 3b housing the processor 9, and a second sub-chamber 3c housing the capture device 11 and the winding bobbin 13 and such, and these sub-chambers are in spatially communicate with each other. The chamber 3 may have other sub-chambers if necessary.

One or more vacuum pumps not shown are connected to the chamber 3 in order to set the interior of the chamber 3 in a depressurized state. The vacuum pumps are connected at least to the first sub-chamber 3a, the main chamber 3b and the second sub-chamber 3c, respectively. Additional vacuum pumps may be connected to additional sub-chambers if they exist.

The first sub-chamber 3a, the main chamber 3b and the second sub-chamber 3c take a form of being piled up vertically in order to hang the reinforcement fiber F vertically down and pass it through the processor 9. Further the main chamber 3b may be vertically elongated in order to ensure a sufficient reaction time in the processor 9. Therefore these elements may take a form in that the second sub-chamber 3c is installed on a first floor in a building, the main chamber 3b on a second floor, and the first sub-chamber 3a on any still upper floor, for example.

At least in between the first sub-chamber 3a and the main chamber 3b and in between the main chamber 3b and the second sub-chamber 3c, gates 15,17 for gas-tightly separating them are provided. To the gate 15,17 applicable are gate-valves but any other types of valves, such as pendulum valves or butterfly valves. Preferably actuators such as hydraulic cylinders are respectively connected thereto for driving the gates 15,17.

Between the first sub-chamber 3a and the main chamber 3b and between the main chamber 3b and the second sub-chamber 3c, gas-tight communication may be established through communication paths respectively. The gates 15,17 may be provided in these communication paths.

The feeding bobbin 5 is housed in the first sub-chamber 3a and an actuator such as a motor is connected thereto for its rotation. When closing the gate 15, as the first sub-chamber 3a is gas-tightly separated from the main chamber 3b, the first sub-chamber 3a is allowed to be exposed to the atmosphere with keeping the main chamber 3b evacuated, thereby allowing carry-in or exchange of the feeding bobbin 5.

In the first sub-chamber 3a, still another device such as a tension detector 19 may be installed. The tension detector 19 is used for the purpose of detecting tension acting on the reinforcement fiber F being fed out.

Figure 2:
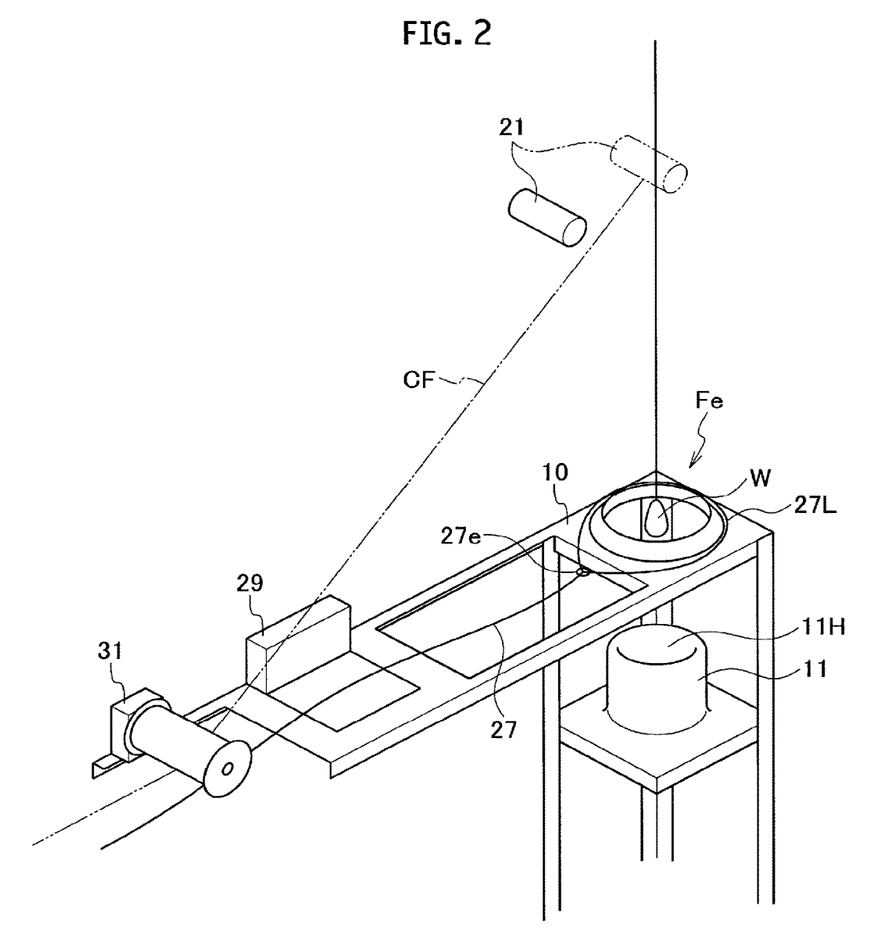
FIG. 2 is a schematic perspective view of a capture device and a resilient cord.

The reinforcement fiber F is wound around the feeding bobbin 5 and is in this state carried therein to serve as a subject for a vacuum processing. Preferably as shown in FIG. 2, a weight W is combined with a leading end Fe of the reinforcement fiber F. The weight W by gravity guides the reinforcement fiber F through the processor 9 to the capture device 11.

Referring again to FIG. 1, the feeding roller 7 is also housed in the first sub-chamber 3a and is arranged specially relative to the processor 9 and the capture device 11. More specifically, the feeding roller 7 is so disposed that, as the reinforcement fiber F fed out of the feeding bobbin 5 passes through the feeding roller 7 and is there hung down vertically, the reinforcement fiber F passes through the processor 9 and reaches the capture device 11. The feeding roller 7 may be fixed to the first sub-chamber 3a or may be made movable to regulate its position.

The processor 9 is housed in the main chamber 3b and has a constitution adapted for executing a vacuum processing such as CVD or PVD. In a case where a coating of boron nitride is to be formed for example, the processor 9 can contain tubing for introducing boron fluoride gas, ammonia gas and nitrogen gas as a carrier and a heating furnace. The constitution of the processor 9 of course has many variations and is properly selected therefrom depending on an intended processing. The reinforcement fiber F hung down from the feeding roller 7 vertically passes through the processor 9 and is thereby subject to a processing such as coating. The processor 9, in particular the heating furnace thereof, may be formed in a cylindrical or circular shape. As the reinforcement fiber F passes its center or its vicinity, uniform processing on the reinforcement fiber F is enabled.

Referring to FIG. 2 in combination with FIG. 1, the capture device 11 is in the second sub-chamber 3c and is so arranged that the leading end Fe of the reinforcement fiber F vertically hung down is drawn by gravity and then naturally falls down onto the capture device 11. More specifically, the leading end Fe of the reinforcement fiber F can reach the capture device 11 generally only by action of gravity, and the capture device 11 captures and keeps the leading end Fe in place. To assist the leading end Fe to reach the capture device 11, any auxiliary guiding device such as a roller or a funnel may be installed there.

Further, in the second sub-chamber 3c for example, a guide roller 21 may be installed. Preferably the guide roller 21 is made movable by an actuator 23. As shown by the solid line in FIG. 2, the guide roller 21 may be retracted so as not to be in contact with the reinforcement fiber F. then the reinforcement fiber F can freely fall down toward the capture device 11. When the vacuum processing is started and the reinforcement fiber CF is to be wound around the winding bobbin 13, the guide roller 21 is advanced as shown by the chained line to get in contact with the processed reinforcement fiber CF, thereby the reinforcement fiber F is kept vertical in the processor 9 although it is obliquely drawn.

Of course, other than the feeding roller 7 and the guide roller 21, any device for guiding the reinforcement fiber F can be installed therein. Such a device may be installed in any of the first sub-chamber 3a, the main chamber 3b and the second sub-chamber 3c.

An upper face of the capture device 11 may be formed in any arbitrary shape including a flat plane and may nevertheless have a dent 11H. As the weight W settles in the dent 11H, the capture device 11 more firmly captures and keeps it in place. In place of the dent 11H, applicable is a hole, a cylinder, or a through-hole, in which the weight W fits. Further in place of, or in addition to, these elements, the capture device 11 may have any induction means such as a magnet for inducing the leading end Fe or the weight W, or any adhesive or any viscoelastic body.

The vacuum processing device 1 may be comprised of an elevator device 25 for elevating the capture device 11. As shown by the solid line in FIG. 3A, before capturing the leading end Fe, the capture device 11 may be elevated. Further as shown by the chained line therein, before winding the processed reinforced fiber CF around the bobbin 13, the capture device 11 may be moved downward. Such up-and-down movement is advantageous in firmly getting the leading end Fe withdrawn by a resilient cord 27 as described below.

Referring to FIG. 2, the vacuum processing device 1 is comprised of the resilient cord 27 in the second sub-chamber 3c, which is for withdrawing the reinforcement fiber F toward the winding bobbin 13. The resilient cord 27, as its leading end 27e is slidably combined with itself, forms a closed loop 27L.

The closed loop 27L is placed on a pedestal 10, which is disposed above or around the capture device 11, thereby at this position surrounding the reinforcement fiber F kept in place by the capture device 11. The pedestal 10 may be fixed there or movable to this position. The pedestal 10 may be a flat plate having a through-hole as shown in the drawing or alternatively formed in a bar-like or belt-like shape.

Figure 3A:
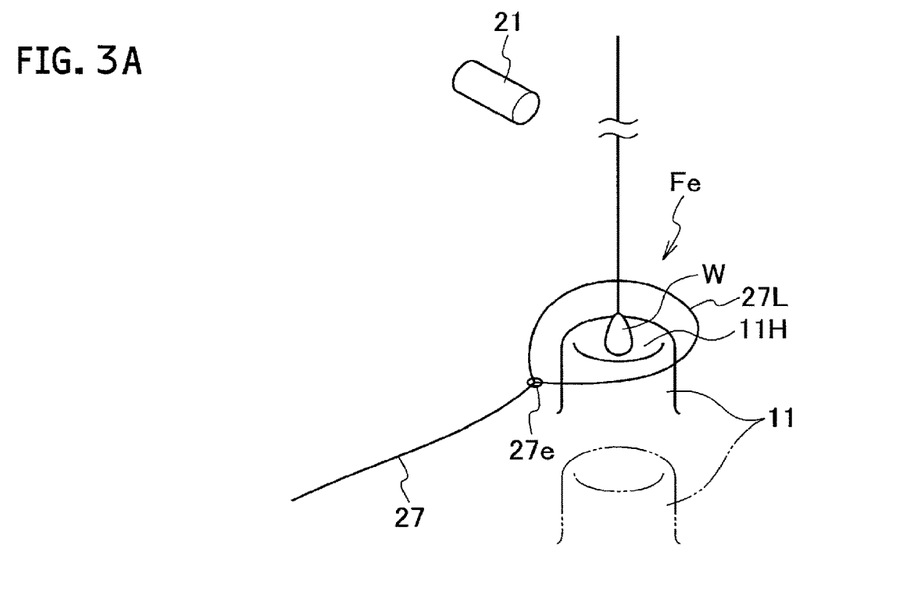
FIG. 3A is a schematic perspective view of a resilient cord forming a closed loop according to an example.
Figure 3B:
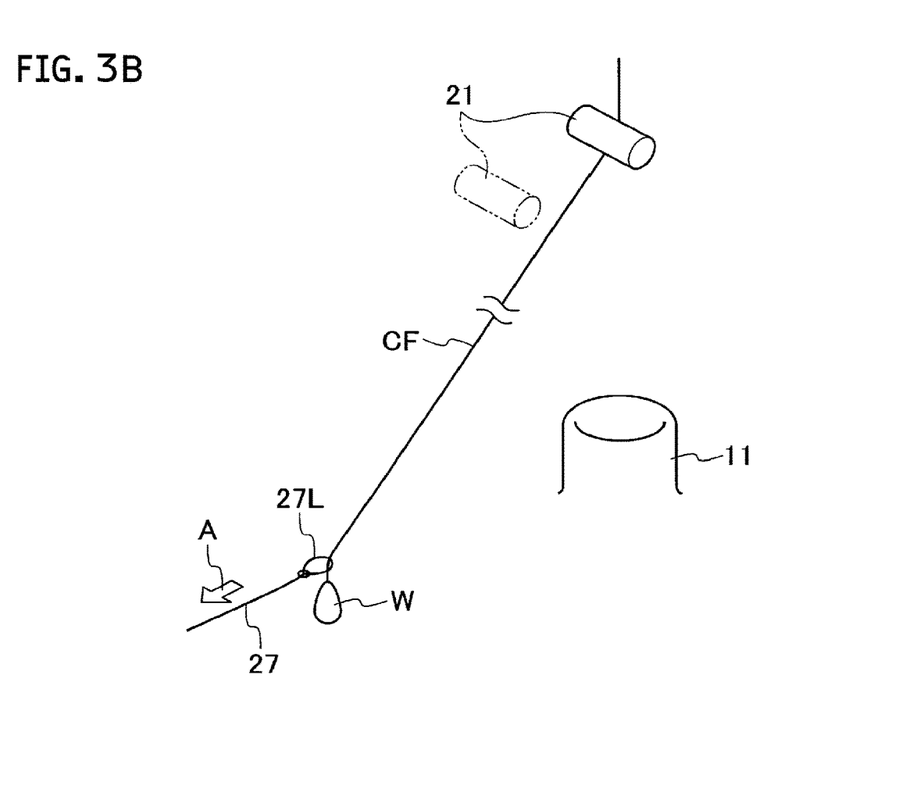
FIG. 3B is a schematic perspective view showing an example in which the resilient cord forming the closed loop withdraws a reinforcement fiber.
Figure 5A:
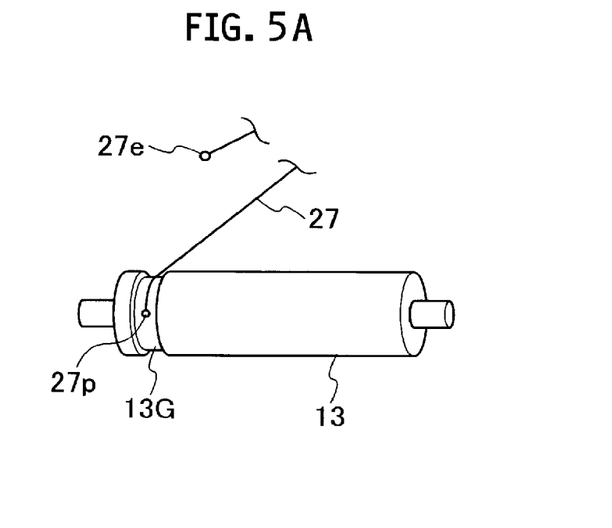
FIG. 5A is a schematic perspective view of a resilient cord and a winding bobbin.

A proximal end 27p of the resilient cord 27 is, as shown in FIG. 5A, combined with the winding bobbin 13 and is, when the winding bobbin 13 rotates, drawn as indicated by the arrow A in FIG. 3B. The resilient cord 27 then gets in contact with the reinforcement fiber F and the leading end Fe slides along the reinforcement fiber F to make the loop 27L shrink so that the loop 27L captures the reinforcement fiber F. As the winding bobbin 13 keeps rotating, the resilient cord 27 withdraws the reinforcement fiber F toward the winding bobbin 13. To withdraw the reinforcement fiber F along with the weight W, the winding bobbin 13 may be comprised of a groove 13G in which the weight W fits and the proximal end 27p may be combined with the groove 13G.

Figure 4A:
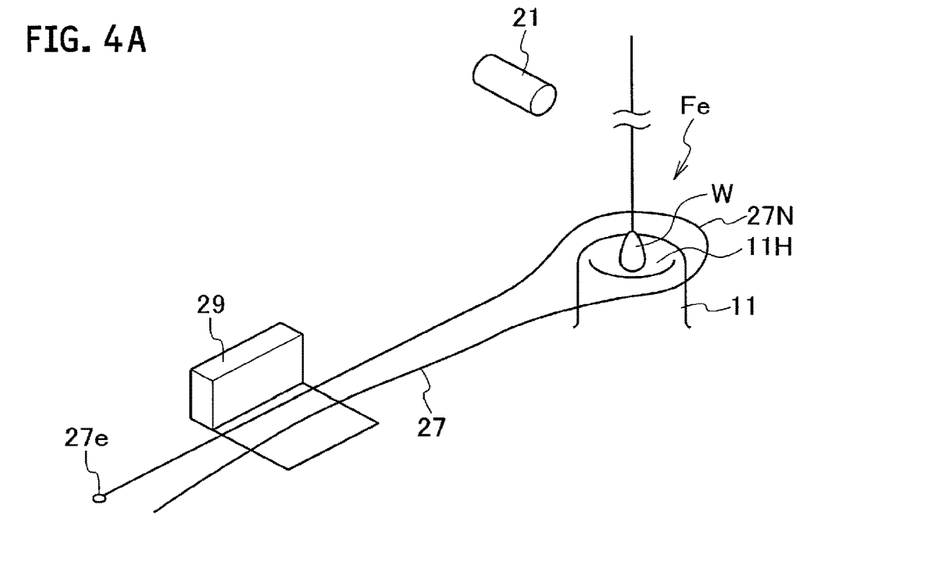
FIG. 4A is a schematic perspective view of a resilient cord forming an open loop according to an example.
Figure 4B:
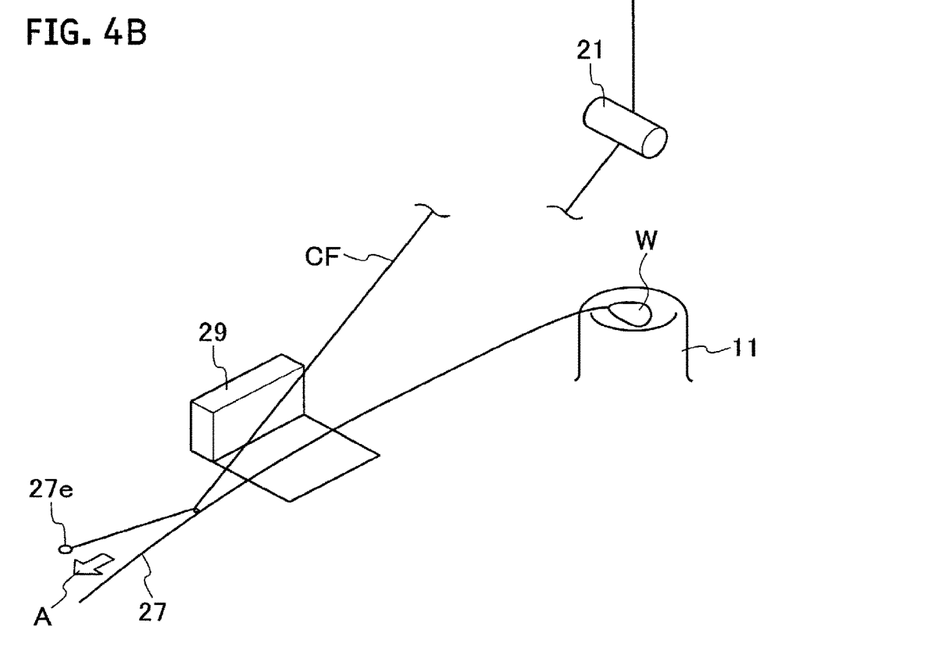
FIG. 4B is a schematic perspective view showing an example in which the resilient cord forming the open loop withdraws a reinforcement fiber.

The resilient cord 27 may, alternatively, as shown in FIG. 4A, form an open loop 27N. Its leading end 27e is fixed to a site other than the resilient cord 27, and the loop 27N is not closed but left opened and as well surrounds the reinforcement fiber F. The proximal end 27p is combined with the winding bobbin 13 as with the above example, so that the resilient cord 27 uses rotation thereof to withdraw the reinforcement fiber F toward the winding bobbin 13 as indicated by the arrow A in FIG. 4B. The resilient cord 27 then does not rest on a fixed site of the reinforcement fiber F but mutually slides when withdrawing the reinforcement fiber F. As the weight W is unlikely to be wound in this example, the weight W may be left on the capture 11 and may be separated by a cutter 29 as described later.

Figure 5B:
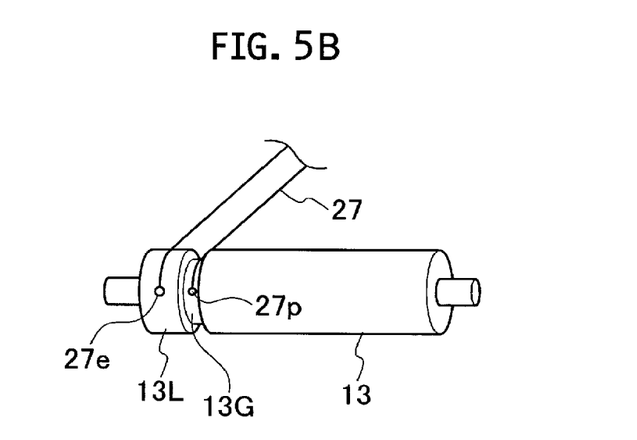
FIG. 5B is a schematic perspective view of a resilient cord and a winding bobbin according to another example.

The leading end 27e may, nevertheless, be combined with the winding bobbin 13 as shown in FIG. 5B. In this case, the groove 13G with which the proximal end 27p is combined and a step portion 13L with which the leading end 27e is combined may be formed different in diameter. Traction speeds of the proximal end 27p and the leading end 27e are differentiated as the diameters are different. Then the resilient cord 27 is prevented from resting on a fixed site of the reinforcement fiber F but slides thereon when withdrawing it.

Still alternatively, it is possible that either or both of the groove 13G and the step portion 13L is rotated in a speed different from the main body of the winding bobbin 13. Any known mechanism such as a planetary gear is applicable thereto. Further, in any of the aforementioned examples, the resilient cord 27 may be connected not to the winding bobbin 13 but to any other induction means that gets in action in synchronism with the winding bobbin 13.

The winding bobbin 13 along with the capture device 11 is housed in the second sub-chamber 3c. Any actuator such as a motor is connected thereto for its rotation. The reinforcement fiber CF processed in the processor 9 is withdrawn by the resilient cord 27, and then wound around the winding bobbin 13. As the main chamber 3b is gas-tightly separated from the second sub-chamber 3c when the gate 17 is closed, the second sub-chamber 3c is allowed to be exposed to the atmosphere with keeping the main chamber 3b evacuated, thereby allowing carry-in and exchange of the winding bobbin 13. The processed reinforcement fiber CF, as being wound around the winding bobbin 13, can be withdrawn.

The weight W may be, along with the reinforcement fiber CF, wound around the winding bobbin 13 but may be separated therefrom in advance of winding. For this purpose, the second sub-chamber 3c may be comprised of a cutter 29 installed therein. Further, it may be comprised of a sensor for determining a time for separating the weight W. In the example shown in FIG. 2, a revolution counter 31 is used, which is so disposed as to get in contact with the processed reinforcement fiber CF. As travel distance of the reinforcement fiber CF is measured by the revolution counter 31, a time proper for separating the weight W can be determined.

The process to execute a vacuum processing on a reinforcement fiber by CVD or PVD in accordance with the present embodiment could be executed in a way as described below for example.

Referring to FIG. 1, the interior of the chamber 3 is kept in a depressurized state by means of vacuum pumps not shown. When the gates 15,17 are closed, the first and second sub-chambers 3a,3c are gas-tightly separated from the main chamber 3b. Next the external air is introduced into the first and second sub-chambers 3a,3c so that they are exposed to the atmosphere. The interior of the main chamber 3b is even then kept in the depressurized stated.

Into the first sub-chamber 3a exposed to the atmosphere, the feeding bobbin 5 around which the reinforcement fiber F is wound is introduced. In a case where an empty feeding bobbin 5 is already in the first sub-chamber 3a, the latter is exchanged for the former. The reinforcement fiber F is drawn out of the introduced feeding bobbin 5, made to pass through the tension detector 19 if installed, made to pass through the feeding roller 7 and hung down therefrom. With its leading end Fe, the weight W is combined.

In parallel, an empty winding bobbin 13 is introduced into the second sub-chamber 3c exposed to the atmosphere. In a case where a winding bobbin 13 around which the processed reinforcement fiber CF is wound is already therein, the latter is exchanged for the former.

After closing the first and second sub-chambers 3a,3c, they are evacuated by means of the pumps not shown. After the degree of vacuum in the interior reaches a desirable level, the gates 15,17 are opened and then the first sub-chamber 3a, the main chamber 3b and the second sub-chamber 3c mutually get in spatial communication. The guide roller 21 then keeps retracting as shown in FIG. 2.

The reinforcement fiber F vertically hung down from the feeding roller 7 passes through the processor 9 disposed in the main chamber 3b. The reinforcement fiber F after passing the processor 9 further falls down vertically and the leading end thereof reaches the capture device 11. The weight w combined with the leading end Fe settles in the capture device 11, thereby keeping the leading end Fe in place. Then the capture device 11 may be elevated to a height comparable to the closed loop 27L or the open loop 27N of the resilient cord 27 on the pedestal 10.

The capture device 11 is moved down and then the reinforcement fiber F is made surrounded by the loop 27L or the loop 27N as shown in FIG. 3A or FIG. 4A. In parallel, the guide roller 21 is advanced to get in contact with the reinforcement fiber F.

The winding bobbin 13 or the induction device is put in action to withdraw the resilient cord 27, thereby making the resilient cord 27 in contact with the reinforcement fiber F and making the resilient cord 27 to accompany the reinforcement fiber F toward the winding bobbin 13. After the reinforcement fiber F reaches the winding bobbin 13 and winding starts, the cutter 29 may be put in action to separate the weight W. Whether it reaches the winding bobbin 13 or not can be determined by using the revolution counter 31.

The processor 9 is put in action to execute a processing such as coating on the reinforcement fiber F, and simultaneously the winding bobbin 13 is rotated to wind the processed reinforcement fiber CF around the winding bobbin 13.

As being understood from the above description, when the vacuum processing ends and the bobbin is subject to exchange, it is necessary to expose the first and second sub-chambers to the atmosphere whereas the main chamber can be kept evacuated. Because the main chamber, as being the largest in both volume and internal area among elements of the vacuum processing device, can be kept evacuated, only a short time is required for evacuation after exchange of bobbins to obtain a desired degree of vacuum. Therefore the vacuum processing can be repeated with high productivity.

The work for combining the fiber with the bobbin can be executed under an evacuated situation in accordance with the present embodiment.

Under the atmospheric pressure, this work would be readily executed by hands. Alternatively a suction nozzle can be used to keep the fiber in place as the fiber can be sucked along with the air into the nozzle, and then a movable arm can be used for withdrawing the fiber. More specifically, if under the atmospheric pressure, this work can be automated. As this work, however, is executed after the fiber passes the main chamber, the main chamber have to be necessarily exposed to the atmosphere. This, as discussed already, seriously hurts productivity. Under the vacuum, both work by hands and suction by a nozzle are impossible.

The present embodiment enables such work under the vacuum as automatic processing because the capture device keeps the reinforcement fiber in place and thereafter the resilient cord withdraws the fiber toward the winding bobbin. Necessarily, the main chamber is not necessitated to be exposed to the atmosphere and therefore high productivity is given.

Although certain embodiments have been described above, modifications and variations of the embodiments described above will occur to those skilled in the art, in light of the above teachings.

INDUSTRIAL APPLICABILITY

A vacuum processing device is provided, which enables exchanging bobbins with keeping the most of the device evacuated.

The invention claimed is:

1. A device of executing vacuum processing on a reinforcement fiber, comprising:
   a chamber capable of keeping the chamber as a whole in a depressurized state;
   a feeding roller so disposed as to hang the reinforcement fiber down in the chamber;
   a processor so disposed in the chamber as to pass the reinforcement fiber hung down in the chamber through the processor;
   a capture device so disposed as to capture and keep a leading end of the reinforcement fiber passing the processor and vertically falling down in place;
   a winding bobbin configured to wind the reinforcement fiber processed by the processor; and
   a resilient cord withdrawn in synchronism with the winding bobbin from a first position where the resilient cord surrounds the leading end kept in place by the capture device to a second position where the resilient cord gets in contact with and leads the reinforcement fiber to the winding bobbin.

2. The device of claim 1, wherein the chamber comprises a first sub-chamber housing the feeding roller, a main chamber housing the processor, and a second sub-chamber housing the capture device, the winding bobbin and the resilient cord, and the main chamber is configured to temporarily get gas-tightly separated from the first sub-chamber and the second sub-chamber.

3. The device of claim 1, wherein a proximal end of the resilient cord is so combined with the winding bobbin as to be withdrawn by rotation of the winding bobbin.

4. The device of claim 3, wherein a distal end of the resilient cord is fixed to a site other than the resilient cord and the resilient cord in the first position forms an open loop surrounding the reinforcement fiber.

5. The device of claim 4, wherein the distal end of the resilient cord is combined with the winding bobbin.

6. A method of executing vacuum processing on a reinforcement fiber, comprising:
   keeping a chamber as a whole in a depressurized state;
   hanging the reinforcement fiber from a feeding roller down in the chamber;
   passing the reinforcement fiber through a processor disposed in the chamber;

disposing a capture device so as to capture and keep a leading end of the reinforcement fiber passing the processor and vertically falling down in place;

disposing a resilient cord at a first position where the resilient cord encloses the leading end kept in place by the capture device above or around the capture device;

withdrawing the resilient cord in synchronism with a winding bobbin to a second position where the resilient cord gets in contact with and leads the reinforcement fiber to the winding bobbin; and making the winding bobbin wind the reinforcement fiber processed by the processor.

7. The method of claim 6, further comprising:

combining a proximal end of the resilient cord with the winding bobbin, wherein the resilient cord is withdrawn by rotation of the winding bobbin in the step of withdrawing the resilient cord.

8. The method of claim 7, further comprising:

fixing a distal end of the resilient cord to a site other than the resilient cord so as to have the resilient cord in the first position form an open loop surrounding the reinforcement fiber.

9. The method of claim 8, further comprising:

combining the distal end of the resilient cord with the winding bobbin.

* * * * *